United States Patent
Li (10) Patent No.: US 11,238,807 B2
(45) Date of Patent: Feb. 1, 2022

(54) ARRAY SUBSTRATE AND DRIVING METHOD THEREOF, DISPLAY PANEL AND DISPLAY DEVICE

(71) Applicants: Hefei Xinsheng Optoelectronics Technology Co., Ltd., Anhui (CN); BOE Technology Group Co., Ltd., Beijing (CN)

(72) Inventor: Yongqian Li, Beijing (CN)

(73) Assignees: Hefei Xinsheng Optoelectronics Technology Co., Ltd, Hefei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/825,426

(22) Filed: Mar. 20, 2020

(65) Prior Publication Data
US 2021/0043145 A1    Feb. 11, 2021

(30) Foreign Application Priority Data
Aug. 5, 2019    (CN) .......................... 201910716149.2

(51) Int. Cl.
*G09G 3/3266*    (2016.01)
*H01L 27/32*    (2006.01)

(52) U.S. Cl.
CPC ....... *G09G 3/3266* (2013.01); *H01L 27/3213* (2013.01); *G09G 2310/0283* (2013.01);
(Continued)

(58) Field of Classification Search
CPC ......... G09G 3/3266; G09G 2310/0283; G09G 2320/0693; G09G 2310/062; G09G 2320/0233
See application file for complete search history.

(56) References Cited

U.S. PATENT DOCUMENTS

2004/0100203 A1    5/2004    Kobayashi et al.
2009/0109148 A1*   4/2009    Tokuda ............... H01L 27/3265
                                                  345/76
(Continued)

FOREIGN PATENT DOCUMENTS

CN    103794176 A    5/2014
CN    106935185 A    7/2017
(Continued)

OTHER PUBLICATIONS

Office Action for corresponding Chinese Application No. 201910716149.2 dated Mar. 16, 2021.

*Primary Examiner* — Md Saiful A Siddiqui
(74) *Attorney, Agent, or Firm* — Arent Fox LLP; Michael Fainberg (57) ABSTRACT

The present disclosure discloses an array substrate and a driving method thereof, a display panel and a display device. The array substrate comprises: a plurality of gate scanning lines extending in a first direction, a plurality of data lines extending in a second direction and detection signal lines, where the data lines and the gate scanning lines are crossed to define a plurality of pixel circuits arranged in an array. The pixel circuits comprise: first transistors, second transistors, driving transistors, capacitors, and light emitting devices, and in the same pixel circuit, the first transistor and the second transistor are electrically connected to different gate scanning lines.

3 Claims, 7 Drawing Sheets

(52) U.S. Cl.
CPC .......... *G09G 2310/062* (2013.01); *G09G 2320/0233* (2013.01); *G09G 2320/0693* (2013.01)

(56) References Cited

U.S. PATENT DOCUMENTS

| | | |
|---|---|---|
| 2015/0356928 A1 | 12/2015 | Xie et al. |
| 2015/0379940 A1* | 12/2015 | Kishi .................. G09G 3/3283 345/690 |
| 2017/0077187 A1* | 3/2017 | Choi ................... H01L 51/5284 |
| 2017/0162112 A1* | 6/2017 | Ha ...................... G09G 3/3233 |
| 2017/0193899 A1 | 7/2017 | Yoon et al. |
| 2018/0151124 A1* | 5/2018 | An ...................... G09G 3/3225 |
| 2019/0066591 A1 | 2/2019 | Xu et al. |
| 2019/0147797 A1 | 5/2019 | Yuan et al. |
| 2021/0201804 A1* | 7/2021 | Feng ..................... G11C 19/28 |

FOREIGN PATENT DOCUMENTS

| | | | |
|---|---|---|---|
| CN | 107393469 A | | 11/2017 |
| CN | 107657923 A | | 2/2018 |
| CN | 109166527 B | * | 1/2019 |
| CN | 109742134 A | | 5/2019 |
| CN | 110061035 A | | 7/2019 |

* cited by examiner

ARRAY SUBSTRATE AND DRIVING METHOD THEREOF, DISPLAY PANEL AND DISPLAY DEVICE

This application claims priority to Chinese Patent Application No. 201910716149.2, filed on Aug. 5, 2019, which is hereby incorporated by reference in its entirety.

FIELD

The present application relates to the field of electroluminescence, and in particular to an array substrate and a driving method thereof, a display panel, and a display device.

BACKGROUND

An electroluminescent device has the advantages of fast response speed, high luminous efficiency, high brightness and the like, so that the performance of a display panel can be greatly improved when the electroluminescent device is applied to the display panel.

The display panel includes a plurality of pixel circuits arranged in an array to drive corresponding electroluminescent devices to emit light. Driving transistors in the pixel circuits have threshold voltages and mobility as characteristic values. The driving transistors are deteriorated according to driving time, and the characteristic values of the driving transistors are also changed. In addition, the change degrees of the characteristic values of the driving transistors are different, as a result, when a same data signal is provided during the display process, the light emitting brightness of the electroluminescent devices is not necessarily the same, and the display uniformity of the display panel is poor.

SUMMARY

Embodiments of the present application provide an array substrate and a driving method thereof, a display panel, and a display device.

In a first aspect, an embodiment of the present application provides an array substrate, including: a plurality of gate scanning lines extending in a first direction, a plurality of data lines extending in a second direction, and a plurality of detection signal lines extending in the second direction, where the plurality of data lines and the plurality of gate scanning lines are crossed to define a plurality of pixel circuits arranged in an array; and each pixel circuit of the plurality of pixel circuits includes: a first transistor, a second transistor, a driving transistor, a capacitor, and a light emitting device, and the first transistor and the second transistor in the each pixel circuit are electrically connected to different gate scanning lines.

For the each pixel circuit, the first transistor is configured to provide a data signal provided by a data line connected to the first transistor to a gate of the driving transistor.

The second transistor is configured to acquire an anode potential of the light emitting device, and provide the anode potential to a corresponding detection signal line.

The driving transistor is configured to drive the light emitting device to emit light according to the data signal.

The capacitor is configured to stabilize a voltage between the gate of the driving transistor and a second electrode of the driving transistor.

Except a last row of pixel circuits of the plurality of pixel circuits, a gate of the second transistor in the each pixel circuits of any row of pixel circuits and a gate of the first transistor in the each pixel circuit of a next row of pixel circuits are electrically connected to the same gate scanning line.

In a possible implementation manner, in the array substrate provided by an embodiment of the present application, in the same pixel circuit, the gate of the first transistor is electrically connected to a gate scanning line in a current row, a first electrode of the first transistor is electrically connected to the data line, and a second electrode of the first transistor is electrically connected to the gate of the driving transistor; the gate of the second transistor is electrically connected to a gate scanning line in a next row, a first electrode of the second transistor is electrically connected to an anode of the light emitting device, and a second electrode of the second transistor is electrically connected to the corresponding detection signal line; a first electrode of the driving transistor is electrically connected to a first voltage signal line, and a second electrode of the driving transistor is electrically connected to the anode of the light emitting device; and a first electrode of the capacitor is electrically connected to the gate of the driving transistor, and a second electrode of the capacitor is electrically connected to the second electrode of the driving transistor.

In a possible implementation manner, in the array substrate provided by an embodiment of the present application, pixel circuits in two adjacent columns of the plurality of pixel circuits are symmetrically arranged.

In a possible implementation manner, in the array substrate provided by an embodiment of the present application, the pixel circuits in two adjacent columns form a group, and pixel circuits in each group share one first voltage signal line.

In a possible implementation manner, in the array substrate provided by an embodiment of the present application, the array substrate includes at least: red sub-pixels, green sub-pixels, blue sub-pixels and white sub-pixels; and the red sub-pixels, the green sub-pixels, the blue sub-pixels and the white sub-pixels are arranged in a grid shape.

In a second aspect, an embodiment of the present application provides a method for driving the array substrate, including: in a display stage, providing gate driving signals to the plurality of gate scanning lines row by row, providing corresponding data signals to the plurality of data lines, and providing fixed potential signals to the plurality of detection signal lines, where time periods during which the gate driving signals are provided to pixel circuits in two adjacent rows of the plurality of pixel circuits have an overlapping time period.

In a possible implementation manner, in the method for driving the array substrate provided by an embodiment of the present application, time periods during which a gate driving signal is provided to a gate scanning line in each row include a first time period and a second time period, where the second time period during which the gate driving signal is provided to the gate scanning line in one row overlaps with the first time period during which the gate driving signal is provided to the gate scanning line in a next row.

In a possible implementation manner, in the method for driving the array substrate provided by an embodiment of the present application, the method further includes: for the each pixel circuit of the pixel circuits in one row, performing following operations in a non-display stage: in a first data writing stage, providing a first voltage signal to the gate scanning line connected to the first transistor in the each pixel circuit, providing the first voltage signal to the gate scanning line connected to the second transistor in the each pixel circuit, and providing a first data signal to the data line connected to the first transistor in the each pixel circuit; in a first charging stage, providing a second voltage signal to the gate scanning line connected to the first transistor in the each pixel circuit, providing the first voltage signal to the gate scanning line connected to the second transistor in the each pixel circuit, and providing a second data signal to the data line connected to the first transistor in the each pixel circuit; and in a mobility detection stage, providing the first voltage signal to the gate scanning line connected to the first transistor in the each pixel circuit, providing the first voltage signal to the gate scanning line connected to the second transistor in the each pixel circuit, and providing the second data signal to the data line connected to the first transistor in the each pixel circuit, where potentials of the first voltage signal and the second voltage signal are opposite, and potentials of the first data signal and the second data signal are opposite.

In a possible implementation manner, in the method for driving the array substrate provided by an embodiment of the present application, the method further includes: for the each pixel circuit of the pixel circuits in one row, performing following operations in a non-display stage: in a second data writing stage, providing a first voltage signal to the gate scanning line connected to the first transistor in the each pixel circuit, providing the first voltage signal to the gate scanning line connected to the second transistor in the each pixel circuit, and providing a first data signal to the data line connected to the first transistor in the each pixel circuit; in a second charging stage, providing the first voltage signal to the gate scanning line connected to the first transistor in the each pixel circuit, providing the first voltage signal to the gate scanning line connected to the second transistor in the each pixel circuit, and providing the first data signal to the data line connected to the first transistor in the each pixel circuit; and in a threshold detection stage, providing the first voltage signal to the gate scanning line connected to the first transistor in the each pixel circuit, providing the first voltage signal to the gate scanning line connected to the second transistor in the each pixel circuit, providing the first data signal to the data line connected to the first transistor in the each pixel circuit.

In a third aspect, an embodiment of the present application further provides a display panel, including: the array substrate provided by any one of the embodiments in the first aspect.

In a fourth aspect, an embodiment of the present application further provides a display device, including: the display panel provided by the embodiment in the third aspect.

DETAILED DESCRIPTION OF THE EMBODIMENTS

Figure 1:
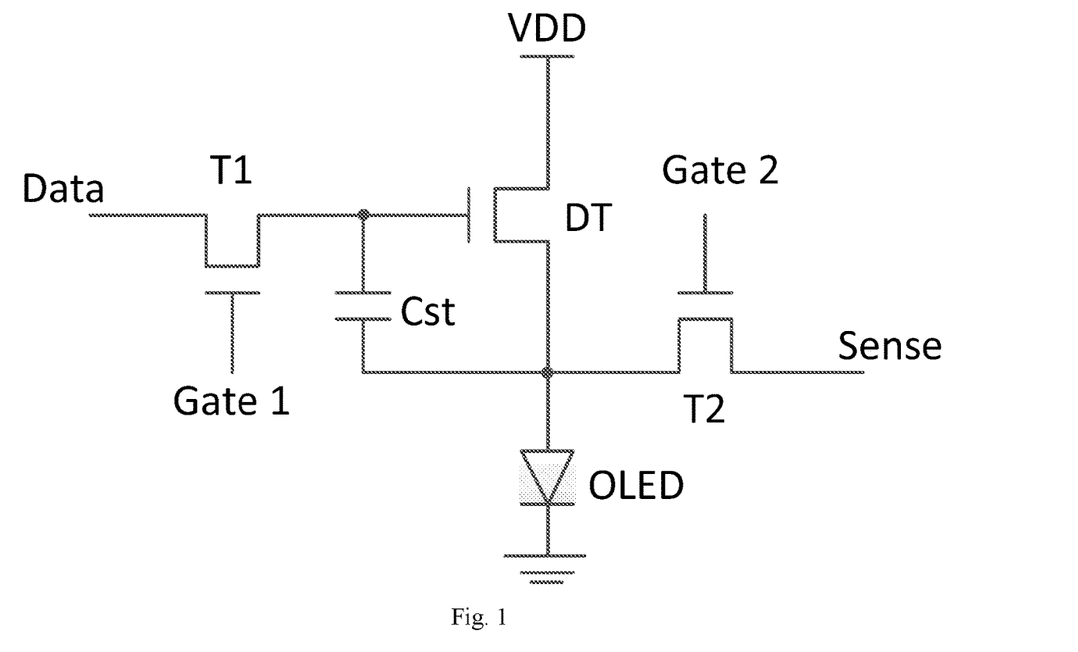
FIG. 1 is a structural schematic diagram of a pixel circuit in the related art.

A pixel circuit in the related art as shown in FIG. 1. The pixel circuit includes a first transistor T1, a second transistor T2, a driving transistor DT, and a capacitor Cst. A gate of the first transistor T1 is electrically connected to a first gate scanning line Gate1, a first electrode of the first transistor T1 is electrically connected to a data line Data, and a second electrode of the first transistor T1 is electrically connected to a gate of the driving transistor DT. A gate of the second transistor T2 is electrically connected to a second gate scanning line Gate2, a first electrode of the second transistor T2 is electrically connected to a detection signal line Sense, and a second electrode of the second transistor T2 is electrically connected to a second electrode of the driving transistor DT. A first electrode of the capacitor Cst is electrically connected to the gate of the driving transistor DT, and a second electrode of the capacitor Cst is electrically connected to the second electrode of the driving transistor DT. A first electrode of the driving transistor DT is electrically connected to a first voltage signal line VDD, and the second electrode of the driving transistor DT is electrically connected to an anode of an electroluminescent device OLED. The first transistor T1 and the second transistor T2 in the pixel circuit are controlled by two different gate scanning lines respectively. Due to the connection relation, data writing and characteristic detection of the driving transistor DT can be controlled separately, and a special compensation requirement can be met.

Figure 2:
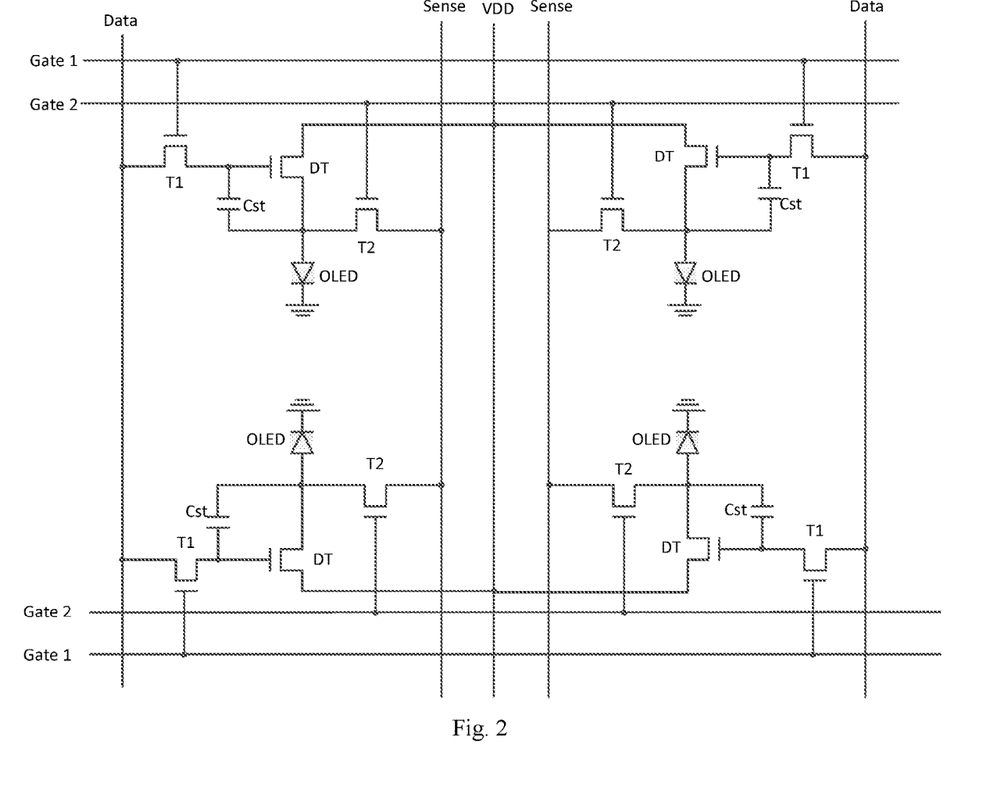
FIG. 2 is a structural schematic diagram of an array substrate in the related art.

However, when the above pixel circuit is applied to an array substrate shown in FIG. 2, two gate scanning lines are required to be arranged for each row of pixel circuits, thus causing problems of occupying a larger wiring space in the array substrate, and being not favorable for realizing high-resolution display.

In view of the above problems in the related art, embodiments of the present application provide an array substrate and a driving method thereof, a display panel, and a display device. In order to make objectives, features, and advantages of the present application more comprehensible, the present application will be further described below with reference to accompanying drawings and the embodiments. However, the exemplary embodiments can be implemented in various manners and should not be construed as limitation on the embodiments set forth herein.

On the contrary, providing the embodiments makes the present application more comprehensive and complete, and fully conveys the concepts of the exemplary embodiments to those skilled in the art. The same reference signs in the accompanying drawings denote the same or similar structures, so repeated description will be omitted. In the present application, words indicating positions and directions are illustrated by way of examples in the accompanying drawings, but changes can also be made as needed, and the changes are included in the protection scope of the present application. The accompanying drawings of the present application are only for indicating the relative position relationship, and do not represent the true scale.

It should be noted that specific details are set forth in following description in order to fully understand the present application. However, the present application can be implemented in many other ways other than those described herein, and those skilled in the art can make similar expansion without departing from the spirit of the present application. Therefore, the present application is not limited by the specific embodiments disclosed below. The preferred embodiments for implementing the present application are described subsequently in the specification, but the described is still for the purpose of illustrating the general principles of the present application, and not intended to limit the scope of the present application. The scope of protection of the present application shall be determined by the scope defined by the appended claims.

An array substrate and a driving method thereof, a display panel, and a display device provided by the embodiments of the present application will be specifically described below with reference to the accompanying drawings.

Figure 3:
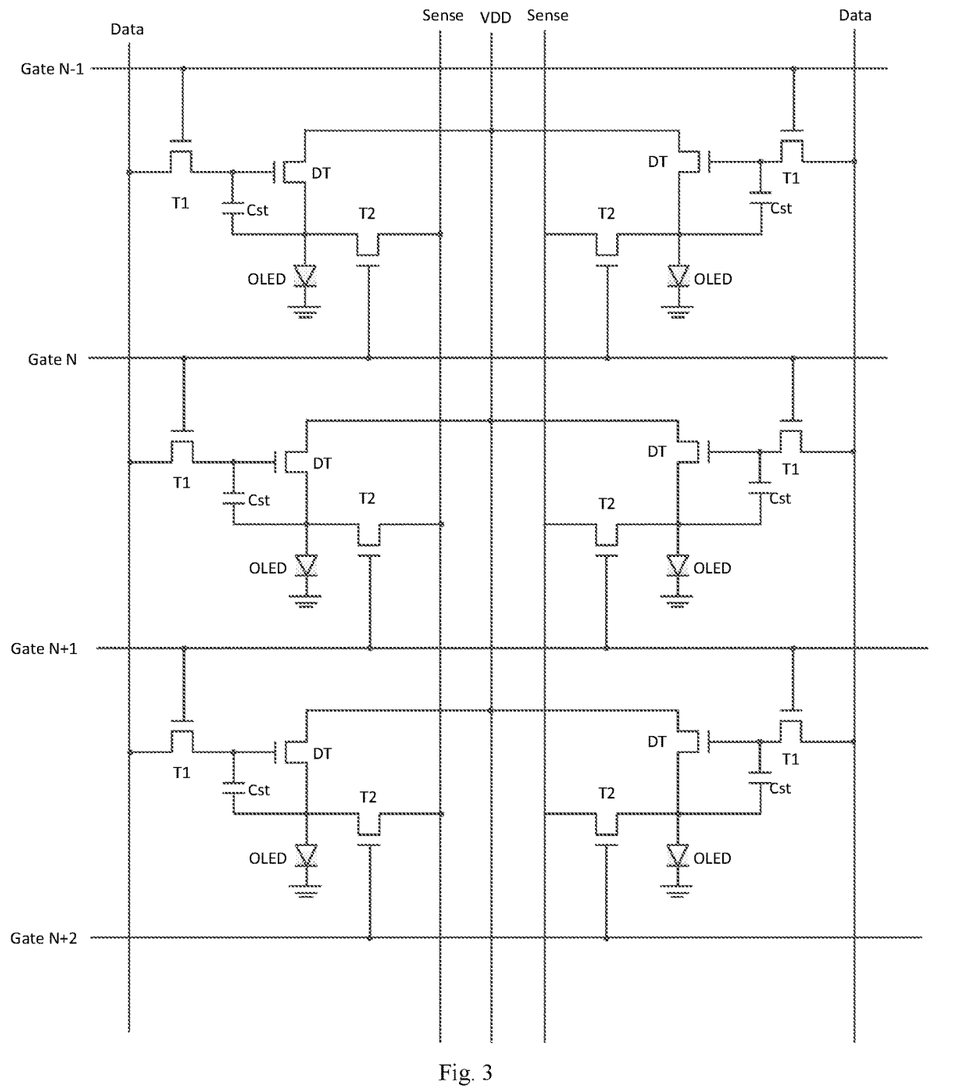
FIG. 3 is a structural schematic diagram of an array substrate provided by an embodiment of the present application.

An embodiment of the present application provides an array substrate, as shown in FIG. 3, including: a plurality of gate scanning lines Gate extending in a first direction, a plurality of data lines Data extending in a second direction and a plurality of detection signal lines Sense extending in the second direction, where the data lines Data and the gate scanning lines Gate are crossed to define a plurality of pixel circuits arranged in an array; each pixel circuit includes: a first transistor T1, a second transistor T2, a driving transistor DT, a capacitor Cst, and a light emitting device OLED.

In the same pixel circuit, the first transistor T1 and the second transistor T2 are electrically connected to different gate scanning lines Gate; the first transistor T1 is configured to provide a data signal provided by a data line Data connected to the first transistor to a gate of the driving transistor DT; the second transistor T2 is configured to acquire an anode potential of the light emitting device OLED, and provide the anode potential to a corresponding detection signal line Sense; the driving transistor DT is configured to drive the light emitting device OLED to emit light according to the data signal; and the capacitor Cst is configured to stabilize a voltage between the gate of the driving transistor DT and a second electrode of the driving transistor DT.

Except a last row of pixel circuits of the plurality of pixel circuits, a gate of the second transistor T2 in the each pixel circuit of any row of pixel circuits and a gate of the first transistor T1 in the each pixel circuit of a next row of pixel circuits are electrically connected to a same gate scanning line Gate.

In the array substrate provided by an embodiment of the present application, by means of electrically connecting the gates of the second transistors in any row of pixel circuits except the last row of pixel circuits, and the gates of the first transistors in the next row of pixel circuits to the same gate scanning line, the number of the gate scanning lines can be reduced while corresponding functions are realized, wiring of the array substrate is simplified, and production cost is saved.

Optionally, in the array substrate provided by an embodiment of the present application, in the same pixel circuit, a gate of the first transistor is electrically connected to the gate scanning line in a current row, a first electrode of the first transistor is electrically connected to the data line, and a second electrode of the first transistor is electrically connected to a gate of the driving transistor; a gate of the second transistor is electrically connected to a gate scanning line in a next row, a first electrode of the second transistor is electrically connected to an anode of the light emitting device, and a second electrode of the second transistor is electrically connected to the corresponding detection signal line; a first electrode of the driving transistor is electrically connected to a first voltage signal line, and a second electrode of the driving transistor is electrically connected to the anode of the light emitting device; and a first electrode of the capacitor is electrically connected to the gate of the driving transistor, and a second electrode of the capacitor is electrically connected to the second electrode of the driving transistor.

Specifically, in the array substrate provided by an embodiment of the present application, each transistor in each pixel circuit may be an N-type transistor or a P-type transistor, which is selected according to actual needs, and is not specifically limited herein.

Optionally, in the array substrate provided by an embodiment of the present application, the pixel circuits in adjacent columns are symmetrically arranged.

Specifically, in the array substrate provided by an embodiment of the present application, the pixel circuits in adjacent columns are symmetrically arranged, so that the pixel circuits in the adjacent columns can share some common potential signal lines, such as high-voltage signal lines or low-voltage signal lines.

Optionally, in the array substrate provided by an embodiment of the present application, the pixel circuits in two adjacent columns form a group, and the pixel circuits in each group shares one first voltage signal line.

Specifically, in the array substrate provided by an embodiment of the present application, the pixel circuits in two adjacent columns share one first voltage signal line, that is, the first electrodes of the driving transistors in the pixel circuits in two adjacent columns are electrically connected to the same first voltage signal line, so that the number of the first voltage signal lines can be halved, that is, the wiring number on the array substrate is reduced to be beneficial to achieving high resolution display.

Optionally, in the array substrate provided by an embodiment of the present application, the array substrate includes at least: red sub-pixels, green sub-pixels, blue sub-pixels and white sub-pixels; and the red sub-pixels, the green sub-pixels, the blue sub-pixels and the white sub-pixels are arranged in a grid shape, e.g. in a shape like a Chinese character "田".

Specifically, in the array substrate provided by an embodiment of the present application, each pixel includes a red sub-pixel, a green sub-pixel, a blue sub-pixel and a white sub-pixel, and the red sub-pixel, the green sub-pixel, the blue sub-pixel and the white sub-pixel are arranged in a shape like a Chinese character "田". Compared with a mode that the red sub-pixels, the green sub-pixels, the blue sub-pixels and the white sub-pixels are arranged along extending directions of the gate scanning lines, the arrangement of the four sub-pixels in each pixel in the shape like a Chinese character "田" can reduce the number of the data lines, thereby increasing an aperture ratio.

Based on the same inventive concept, an embodiment of the present application further provides a method driving for the array substrate, including: in a display stage, providing gate driving signals to the plurality of gate scanning lines row by row, providing corresponding data signals to the plurality of data lines, and providing fixed potential signals to the plurality of detection signal lines, where time periods during which the gate driving signals are provided to the pixel circuits in two adjacent rows of the plurality of pixel circuits have an overlapping time period.

Optionally, in the method for driving the array substrate provided by an embodiment of the present application, time periods during which a gate driving signal is provided to a gate scanning line in each row include a first time period and a second time period, where the second time period during which the gate driving signal is provided to the gate scanning line in one row overlaps with the first time period during which the gate driving signal is provided to the gate scanning line in a next row.

Figure 4:
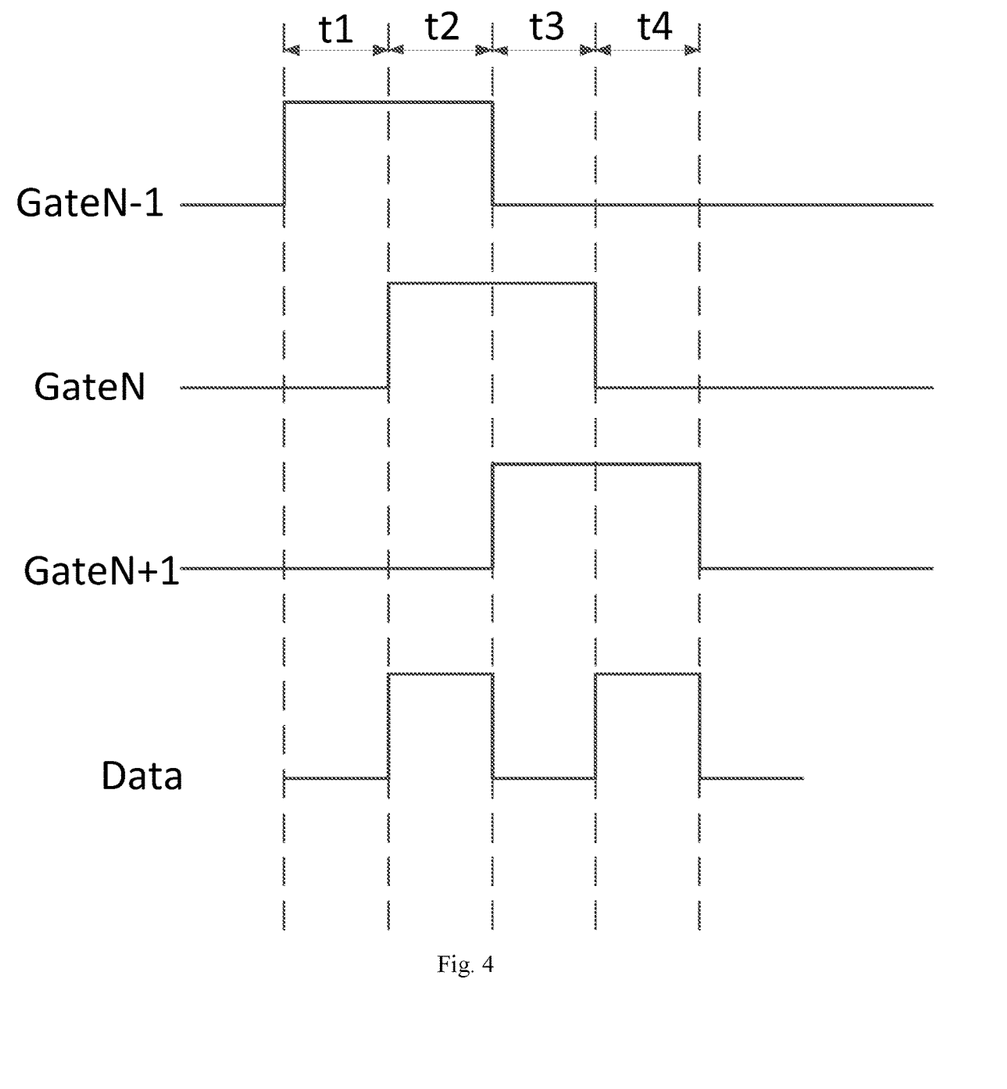
FIG. 4 is a corresponding timing diagram of the array substrate shown in FIG. 3 in a display stage.

The driving method in the display stage is described below with reference to the array substrate in FIG. 3 and the timing diagram in FIG. 4.

In a stage t1, a gate scanning line GateN−1 in the (N−1)th row is at a high level, that is, first transistors T1 of pixel circuits in the (N−1)th row are turned on, and signals provided by data lines Data are used to precharge the pixel circuits in the (N−1)th row; in a stage t2, the gate scanning line GateN−1 in the (N−1)th row and a gate scanning line GateN in the Nth row are both at a high level, that is, first transistors T1 of pixel circuits in the Nth row are turned on, and data signals provided by the data lines Data are written to gates of driving transistors DT, at the same time, first transistors T1 of pixel circuits in a next row are also turned on, and the data signals (that is, the data signals corresponding to the pixel circuits in the previous row) of the data lines Data are used to precharge the pixel circuits in the next row; in a stage t3, data writing is performed on the pixel circuits in the Nth row, and pixel circuits in the (N+1)th row are precharged; and in a stage t4, data writing is performed on the pixel circuits in the (N+1)th row.

It should be noted that the fixed potential signals are provided to the detection signal lines at each of the above stages to ensure the voltages at both ends of each capacitor, thereby ensuring that the pixel circuits in each row can work normally.

Optionally, in the method for driving the array substrate provided by an embodiment of the present application, the method further includes: for the each pixel circuit of the pixel circuits in one row, performing following operations in a non-display stage: in a first data writing stage, providing a first voltage signal to the gate scanning line connected to the first transistor in the each pixel circuit, providing the first voltage signal to the gate scanning line connected to the second transistor in the each pixel circuit, and providing a first data signal to the data line connected to the first transistor in the each pixel circuit; in a first charging stage, providing a second voltage signal to the gate scanning line connected to the first transistor in the each pixel circuit, providing the first voltage signal to the gate scanning line connected to the second transistor in the each pixel circuit, and providing a second data signal to the data line connected to the first transistor in the each pixel circuit; and in a mobility detection stage, providing the first voltage signal to the gate scanning line connected to the first transistor in the each pixel circuit, providing the first voltage signal to the gate scanning line connected to the second transistor in the each pixel circuit, and providing the second data signal to the data line connected to the first transistor in the each pixel circuit, where potentials of the first voltage signal and the second voltage signal are opposite, and potentials of the first data signal and the second data signal are opposite.

It should be noted that when the transistors in the pixel circuits are N-type transistors, the first voltage signal is a high-level signal and the second voltage signal is a low-level signal; and when the transistors in the pixel circuits are P-type transistors, the first voltage signal is a low-level signal, and the second voltage signal is a high-level signal.

Figure 5:
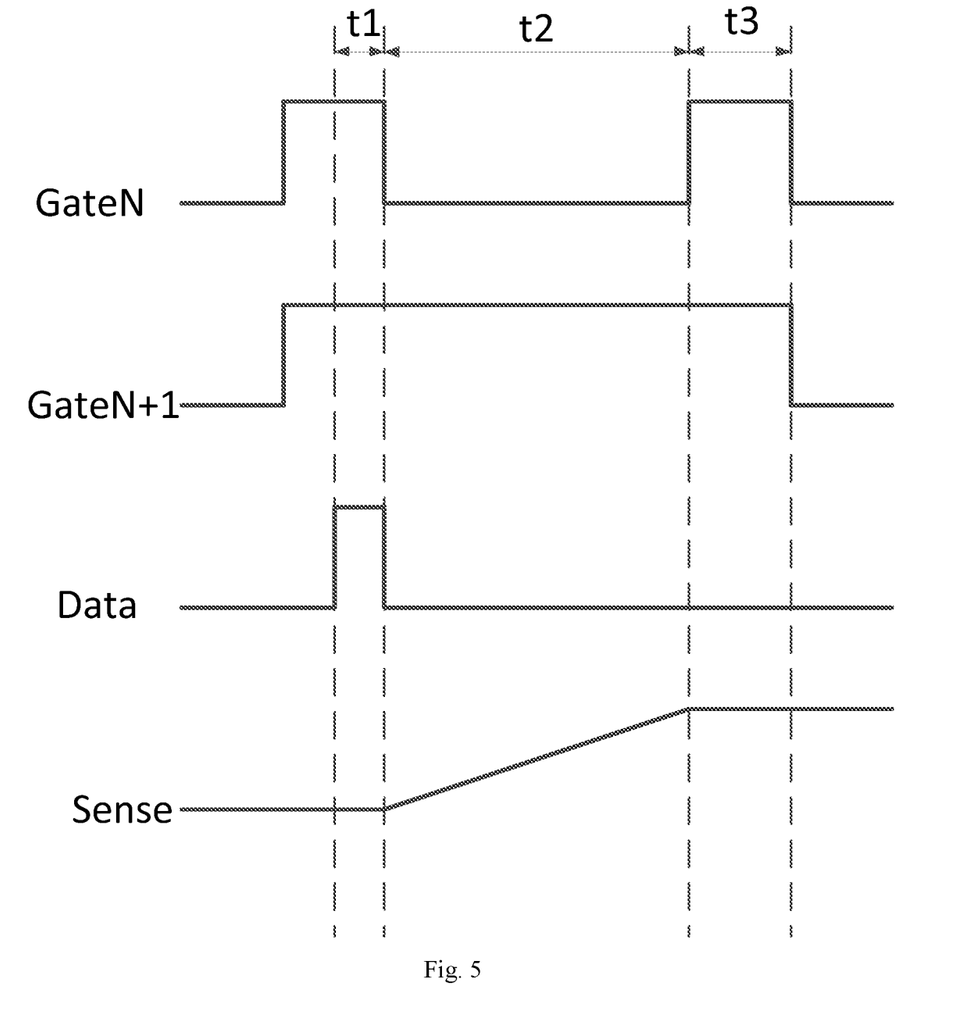
FIG. 5 is a timing diagram of the array substrate shown in FIG. 3 during mobility detection of driving transistors.

A process of detecting the mobility of the driving transistors in the non-display stage is described below with reference to the array substrate in FIG. 3 and the timing diagram in FIG. 5.

In the stage t1 (the first data writing stage), the gate scanning line GateN in the Nth row is at a high level, so that the first transistors T1 of the pixel circuits in the Nth row are turned on, and the data signals are written to the gates of the driving transistors DT. At this time, the gate scanning line GateN+1 in the (N+1)th row is also at a high level, the second transistors T2 of the pixel circuits in the Nth row are also in a conductive state, and signals of the second electrodes of the driving transistors DT in the pixel circuits in the (N+1)th row are provided to the detection signal lines Sense in real time.

In the stage t2 (the first charging stage), the gate scanning line GateN in the Nth row is at a low level, and the first transistors T1 of the pixel circuits in the Nth row are turned off, the gate scanning line GateN+1 in the (N+1)th row is at a high level, and a signal line VDD charges the pixel circuits in the current row, so that voltages on the detection signal lines Sense rises.

In the stage t3 (the mobility detection stage), the gate scanning line GateN in the Nth row is at a high level, so that the first transistors T1 of the pixel circuits in the Nth row are turned on; the low level signals provided by the data signals are provided to the gates of the driving transistors DT, so that the driving transistors DT are turned off, charging is ended, and the detection signal lines Sense acquire the mobility of the driving transistors DT.

The above process is described by taking the transistors in the pixel circuits as N-type transistors as an example. When the transistors in the pixel circuits are P-type transistors, the principle is the same, which is not repeatedly described herein.

Optionally, the method for driving the array substrate provided by an embodiment of the present application further includes: for the each pixel circuit of the pixel circuits in one row, performing following operations in a non-display stage: in a second data writing stage, providing a first voltage signal to the gate scanning line connected to the first transistor in the each pixel circuit, providing the first voltage signal to the gate scanning line connected to the second transistor in the each pixel circuit, and providing a first data signal to the data line connected to the first transistor in the each pixel circuit; in a second charging stage, providing the first voltage signal to the gate scanning line connected to the first transistor in the each pixel circuit, providing the first voltage signal to the gate scanning line connected to the second transistor in the each pixel circuit, and providing the first data signal to the data line connected to the first transistor in the each pixel circuit; and in a threshold detection stage, providing the first voltage signal to the gate scanning line connected to the first transistor in the each pixel circuit, providing the first voltage signal to the gate scanning line connected to the second transistor in the each pixel circuit, providing the first data signal to the data line connected to the first transistor in the each pixel circuit.

Figure 6:
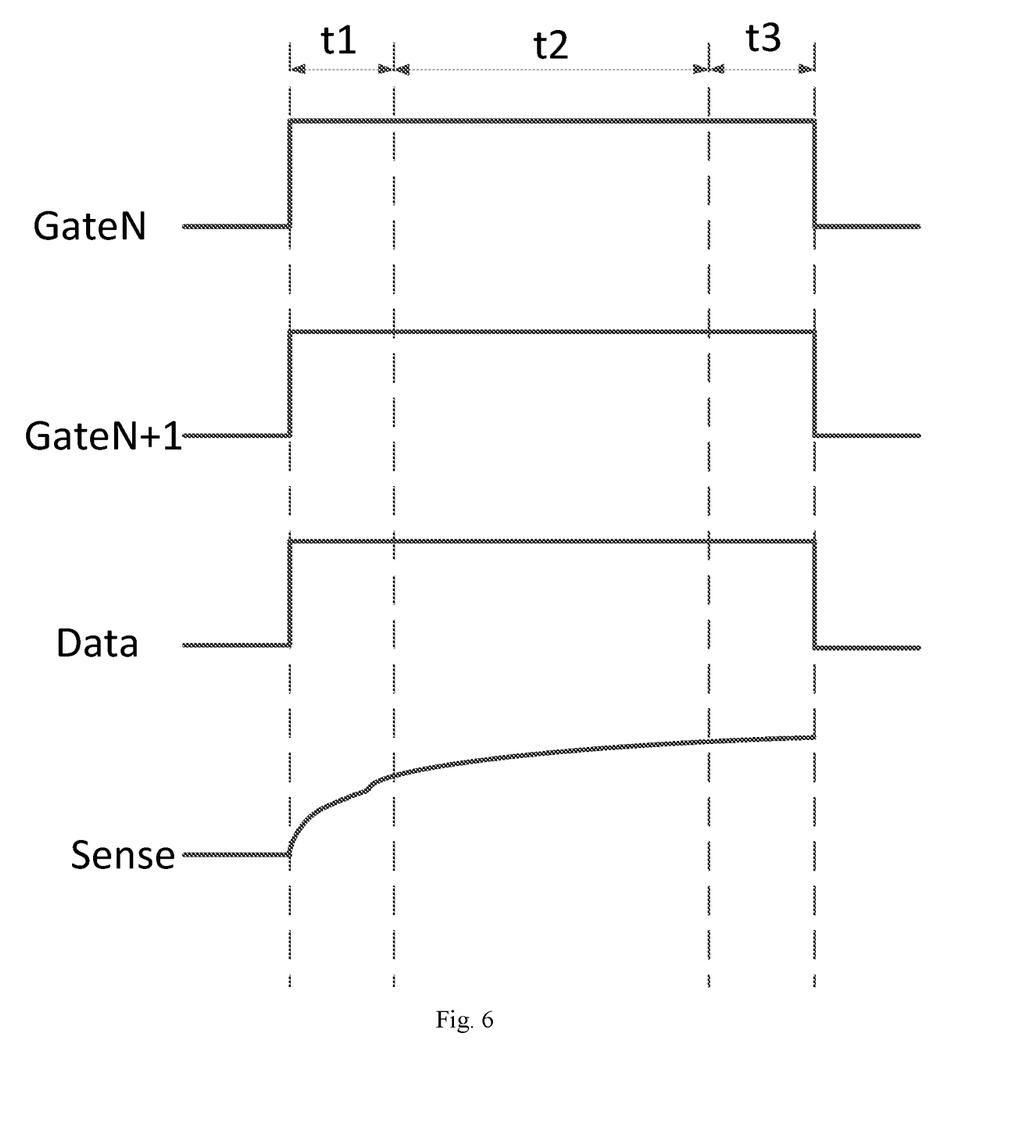
FIG. 6 is a timing diagram of the array substrate shown in FIG. 3 during threshold detection of the driving transistors.

A process of detecting threshold voltages of the driving transistors in the non-display stage is described below with reference to the array substrate in FIG. 3 and the timing diagram in FIG. 6.

In the stage t1 (the second data writing stage), the gate scanning line GateN in the Nth row is at a high level, so that the first transistors T1 of the pixel circuits in the Nth row are turned on, and data signals are written to the gates of the driving transistors DT. At this time, the gate scanning line GateN+1 in the (N+1)th row is also at a high level, the second transistors T2 of the pixel circuits in the Nth row are also in a conductive state, and signals of the second electrodes of the driving transistors DT in the pixel circuit in the (N+1)th row are provided to the detection signal lines Sense in real time.

In the stage t2 (the second charging stage), the gate scanning line GateN in the Nth row is at a high level, and the first transistors T1 of the pixel circuits in the Nth row are turned on, the gate scanning line GateN+1 in the (N+1)th row is at a high level, and the signal line VDD charges the pixel circuits in the current row, so that the voltages on the detection signal lines Sense rise. Because the threshold detection time is long, the time set in the time period t2 is long, and therefore the voltages on the detection signal lines Sense rise slowly.

In the stage t3 (the threshold detection stage), the gate scanning line GateN in the Nth row is at a high level, so that the first transistors T1 of the pixel circuits in the Nth row are turned on, and the gate scanning line GateN+1 in the (N+1)th row is also at a high level, the second transistors T2 of the pixel circuits in the Nth row are also in a conductive state, and the signals of the second electrodes of the driving transistors DT in the pixel circuits in the (N+1)th row are provided to the detection signal lines Sense in real time, so that the detection signal lines Sense acquire the threshold voltages of the driving transistors DT.

The above process is described by taking the transistor in the pixel circuits as N-type transistors as an example. When the transistors in the pixel circuits are P-type transistors, the principle is the same, which is not repeatedly described herein.

It should be noted that the mobility detection and threshold detection processes of the driving transistors in the above embodiments are performed in the non-display stage, that is, in a blank stage between frames, and the two processes can be performed in a same blank stage, and can also be performed in different blank stages, which is not specifically limited herein.

Based on the same inventive concept, an embodiment of the present application further provides a display panel, including an array substrate provided by any one of the above embodiments, a package housing, and the like.

The display panel has the advantages of the array substrate in the above embodiments, and has same principle and implementation modes as the array substrate in the above embodiments. Therefore, the display panel can be implemented by referring to the embodiments of the above array substrate, and details are not described herein.

Figure 7:
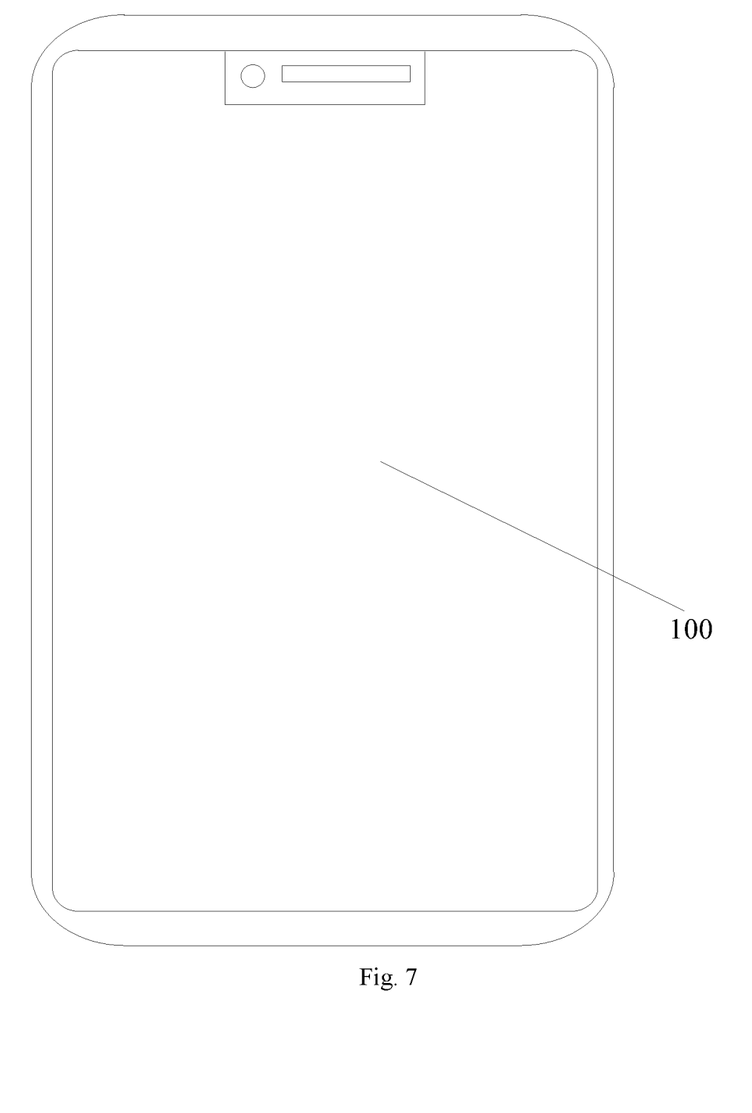
FIG. 7 is a structural schematic diagram of a display device provided by an embodiment of the present application.

Based on the same inventive concept, as shown in FIG. 7, an embodiment of the present application further provides a display device, including a display panel 100 provided by the above embodiment, an earpiece, a camera, a photosensitive element, and the like.

The embodiments of the present application provide an array substrate and a driving method thereof, a display panel and a display device. The array substrate includes: a plurality of gate scanning lines extending in a first direction, a plurality of data lines extending in a second direction and detection signal lines, where the data lines and the gate scanning lines are crossed to define a plurality of pixel circuits arranged in an array; the pixel circuits include: first transistors, second transistors, driving transistors, capacitors and light emitting devices, and the first transistor and the second transistor in the same pixel circuit are electrically connected to different gate scanning lines; the first transistors are configured to provide data signals provided by the connected data lines to gates of the driving transistors; the second transistors are configured to acquire anode potentials of the light emitting devices, and provide the anode potentials to the corresponding detection signal lines; the driving transistors are configured to drive the light emitting devices to emit light according to the data signals; the capacitors are configured to stabilize voltages between the gates of the driving transistors and the second electrodes of the driving transistors. By means of electrically connecting gates of the second transistors in any row of pixel circuits except the last row of pixel circuits, and gates of the first transistors in the next row of pixel circuits to the same gate scanning line, the number of the gate scanning lines can be reduced while corresponding functions are realized, wiring of the array substrate is simplified, and production cost is saved.

Although the preferred embodiments of the present application have been described, those skilled in the art can make other changes and modifications to the embodiments once they know the basic inventive concepts. Therefore, the appended claims are intended to be construed to include the preferred embodiments and all changes and modifications that fall within the scope of the present application.

Obviously, those skilled in the art can make various modifications and variations to the present application without departing from the spirit and scope of the present application. In this way, if these modifications and variations of the present application fall within the scope of the claims of the present application and equivalent technologies thereof, the present application also intends to include these modifications and variations.

The invention claimed is:

1. A method for driving an array substrate, wherein the array substrate comprises:
   a plurality of gate scanning lines extending in a first direction;
   a plurality of data lines extending in a second direction and a plurality of detection signal lines extending in the second direction, wherein the plurality of data lines and the plurality of gate scanning lines are crossed to define a plurality of pixel circuits arranged in an array;
   wherein each pixel circuit of the plurality of pixel circuits comprises: a first transistor, a second transistor, a driving transistor, a capacitor, and a light emitting device, and the first transistor and the second transistor in the each pixel circuit are electrically connected to different gate scanning lines;
   for the each pixel circuit, the first transistor is configured to provide a data signal provided by a data line connected to the first transistor to a gate of the driving transistor;
   the second transistor is configured to acquire an anode potential of the light emitting device, and provide the anode potential to a corresponding detection signal line;
   the driving transistor is configured to drive the light emitting device to emit light according to the data signal; and
   the capacitor is configured to stabilize a voltage between the gate of the driving transistor and a second electrode of the driving transistor;
wherein except a last row of pixel circuits of the plurality of pixel circuits, a gate of the second transistor in the each pixel circuit of any row of pixel circuits and a gate of the first transistor in the each pixel circuit of a next row of pixel circuits are directly connected to a same gate scanning line;
   wherein the method comprises:
   in a display stage, providing gate driving signals to the plurality of gate scanning lines row by row, providing corresponding data signals to the plurality of data lines, and providing fixed potential signals to the plurality of detection signal lines, wherein time periods during which the gate driving signals are provided to pixel circuits in two adjacent rows of the plurality of pixel circuits have an overlapping time period;

wherein the method further comprises:

for the each pixel circuit of the pixel circuits in one row, performing following operations in a non-display stage:

in a first data writing stage, providing a first voltage signal to the gate scanning line connected to the first transistor in the each pixel circuit, providing the first voltage signal to the gate scanning line connected to the second transistor in the each pixel circuit, and providing a first data signal to the data line connected to the first transistor in the each pixel circuit;

in a first charging stage, providing a second voltage signal to the gate scanning line connected to the first transistor in the each pixel circuit, providing the first voltage signal to the gate scanning line connected to the second transistor in the each pixel circuit, and providing a second data signal to the data line connected to the first transistor in the each pixel circuit; and in a mobility detection stage, providing the first voltage signal to the gate scanning line connected to the first transistor in the each pixel circuit, providing the first voltage signal to the gate scanning line connected to the second transistor in the each pixel circuit, providing the second data signal to the data line connected to the first transistor in the each pixel circuit;

wherein potentials of the first voltage signal and the second voltage signal are opposite, and potentials of the first data signal and the second data signal are opposite.

2. The method for driving the array substrate according to claim 1, wherein time periods during which a gate driving signal is provided to a gate scanning line in each row comprise a first time period and a second time period, wherein the second time period during which the gate driving signal is provided to the gate scanning line in one row overlaps with the first time period during which the gate driving signal is provided to the gate scanning line in a next row.

3. The method for driving the array substrate according to claim 1, wherein the method further comprises:

for the each pixel circuit of the pixel circuits in one row, performing following operations in a non-display stage:

in a second data writing stage, providing a first voltage signal to the gate scanning line connected to the first transistor in the each pixel circuit, providing the first voltage signal to the gate scanning line connected to the second transistor in the each pixel circuit, and providing a first data signal to the data line connected to the first transistor in the each pixel circuit;

in a second charging stage, providing the first voltage signal to the gate scanning line connected to the first transistor in the each pixel circuit, providing the first voltage signal to the gate scanning line connected to the second transistor in the each pixel circuit, and providing the first data signal to the data line connected to the first transistor in the each pixel circuit; and in a threshold detection stage, providing the first voltage signal to the gate scanning line connected to the first transistor in the each pixel circuit, providing the first voltage signal to the gate scanning line connected to the second transistor in the each pixel circuit, and providing the first data signal to the data line connected to the first transistor in the each pixel circuit.

* * * * *

UNITED STATES PATENT AND TRADEMARK OFFICE
CERTIFICATE OF CORRECTION

| | | |
|---|---|---|
| PATENT NO. | : 11,238,807 B2 | Page 1 of 1 |
| APPLICATION NO. | : 16/825426 | |
| DATED | : February 1, 2022 | |
| INVENTOR(S) | : Yongqian Li | |

It is certified that error appears in the above-identified patent and that said Letters Patent is hereby corrected as shown below:

On the Title Page

Item (71) The Applicants reads:
"Hefei Xinsheng Optoelectronics Technology Co., Ltd., Anhui (CN); BOE Technology Group Co., Ltd., Beijing (CN)"

Should read:
-- Hefei Xinsheng Optoelectronics Technology Co., Ltd., Hefei (CN); BOE Technology Group Co., Ltd., Beijing (CN) --

Signed and Sealed this
Twenty-fifth Day of June, 2024

Katherine Kelly Vidal
*Director of the United States Patent and Trademark Office*